(12) United States Patent
Sines et al.

(10) Patent No.: US 10,329,455 B2
(45) Date of Patent: Jun. 25, 2019

(54) CHEMICAL MECHANICAL PLANARIZATION SLURRY AND METHOD FOR FORMING SAME

(71) Applicant: SAINT-GOBAIN CERAMICS & PLASTICS, INC., Worcester, MA (US)

(72) Inventors: Ian T. Sines, Bellingham, MA (US); Angela Kwapong, Worcester, MA (US); Carlijn L. Mulder, Minneapolis, MN (US); Douglas E. Ward, Santa Ana, CA (US); Vianney Le Roux, Antibes (FR)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 0 days.

(21) Appl. No.: 15/710,897

(22) Filed: Sep. 21, 2017

(65) Prior Publication Data

US 2018/0086944 A1 Mar. 29, 2018

Related U.S. Application Data

(60) Provisional application No. 62/398,960, filed on Sep. 23, 2016.

(51) Int. Cl.
| | |
|---|---|
| *C09G 1/04* | (2006.01) |
| *C09K 3/14* | (2006.01) |
| *H01L 21/306* | (2006.01) |
| *C09G 1/02* | (2006.01) |

(52) U.S. Cl.
CPC .......... *C09G 1/04* (2013.01); *C09G 1/02* (2013.01); *C09K 3/1463* (2013.01); *H01L 21/30625* (2013.01); *C09K 3/1436* (2013.01)

(58) Field of Classification Search
CPC .......... C09G 1/04; C09G 1/02; C09K 3/1463; C09K 3/1436; H01L 21/30625
See application file for complete search history.

(56) References Cited

U.S. PATENT DOCUMENTS

| | | | |
|---|---|---|---|
| 5,693,239 A * | 12/1997 | Wang | C09G 1/02 216/100 |
| 5,861,349 A | 1/1999 | Vereschagin et al. | |
| 5,916,966 A | 6/1999 | Vereschagin et al. | |
| 6,211,089 B1 | 4/2001 | Kim et al. | |
| 6,242,351 B1 | 6/2001 | Li et al. | |
| 6,258,137 B1 | 7/2001 | Garg et al. | |
| 6,258,721 B1 | 7/2001 | Li et al. | |
| 6,468,913 B1 | 10/2002 | Pasqualoni et al. | |
| 6,488,767 B1 | 12/2002 | Xu et al. | |
| 6,596,079 B1 | 7/2003 | Vaudo et al. | |
| 6,875,082 B2 | 4/2005 | Nakayama et al. | |
| 6,951,695 B2 | 10/2005 | Xu et al. | |
| 7,118,813 B2 | 10/2006 | Xu et al. | |
| 7,241,206 B1 | 7/2007 | Sung | |
| 8,980,113 B2 | 3/2015 | Wang et al. | |
| 9,343,321 B2 | 5/2016 | Wang et al. | |
| 2002/0062600 A1 | 5/2002 | Mandigo et al. | |
| 2003/0124850 A1 | 7/2003 | Minamihaba et al. | |
| 2004/0082275 A1 | 4/2004 | Mahulikar et al. | |
| 2004/0175942 A1* | 9/2004 | Chang | C09G 1/02 438/689 |
| 2005/0093003 A1 | 5/2005 | Shibata | |
| 2005/0150598 A1 | 7/2005 | Moeggenborg et al. | |
| 2006/0029832 A1 | 2/2006 | Xu et al. | |
| 2006/0108325 A1 | 5/2006 | Everson et al. | |
| 2006/0236922 A1 | 10/2006 | Ishibashi et al. | |
| 2007/0039246 A1 | 2/2007 | Liu | |
| 2007/0231245 A1 | 10/2007 | Kumasaka et al. | |
| 2007/0231978 A1 | 10/2007 | Kanamoto et al. | |
| 2007/0254401 A1 | 11/2007 | Nishiura et al. | |
| 2008/0057608 A1 | 3/2008 | Ishibashi et al. | |
| 2008/0057713 A1 | 3/2008 | Desai et al. | |
| 2008/0070482 A1 | 3/2008 | Yamada et al. | |
| 2008/0124510 A1 | 5/2008 | Xu et al. | |
| 2008/0139089 A1 | 6/2008 | Aoki et al. | |
| 2008/0188165 A1 | 8/2008 | Sakaguchi et al. | |

(Continued)

FOREIGN PATENT DOCUMENTS

| | | |
|---|---|---|
| CN | 1378238 A | 11/2002 |
| CN | 1541287 A | 10/2004 |
| CN | 1560161 A | 1/2005 |
| CN | 1985306 A | 6/2007 |
| CN | 101335205 A | 12/2008 |
| CN | 102153990 A | 8/2011 |
| EP | 1288162 A2 | 3/2003 |
| EP | 1717286 A1 | 4/2006 |
| JP | H08336739 A | 12/1996 |
| JP | 2000015560 A | 1/2000 |
| JP | 2004331686 A | 11/2004 |
| JP | 2007075948 A | 3/2007 |
| KR | 20060112232 A | 10/2006 |
| KR | 20090015017 A | 2/2009 |
| TW | 201615789 A | 5/2016 |
| WO | 2010105240 A2 | 9/2010 |
| WO | 2016032820 A1 | 3/2016 |
| WO | 2018057674 A1 | 3/2018 |

OTHER PUBLICATIONS

Hanser, D. et al; "Surface Preparation of Substrates from Bulk GaN Crystals;" Journal of Crystal Growth, 2007, pp. 372-376, vol. 305, Elsevier.

(Continued)

*Primary Examiner* — Duy Vu N Deo
(74) *Attorney, Agent, or Firm* — Abel Schillinger, LLP; Adam Keser

(57) ABSTRACT

A CMP slurry including a carrier, a particulate material within the carrier including an oxide, carbide, nitride, boride, diamond or any combination thereof, an oxidizer including at least one material selected from the group of peroxides, persulfates, permanganates, periodates, perchlorates, hypocholorites, iodates, peroxymonosulfates, cerric ammonium nitrate, periodic acid, ferricyanides, or any combination thereof, and a material removal rate index (MRR) of at least 500 nm/hr and an average roughness index (Ra) of not greater than 5 Angstroms according to the Standardized Polishing test.

19 Claims, No Drawings

(56) References Cited

U.S. PATENT DOCUMENTS

| | | | |
|---|---|---|---|
| 2008/0303118 | A1 | 12/2008 | Arena et al. |
| 2009/0004092 | A1 | 1/2009 | Dolmatov |
| 2009/0047787 | A1 | 2/2009 | Li et al. |
| 2010/0227532 | A1 | 9/2010 | Ishibashi et al. |
| 2010/0233880 | A1 | 9/2010 | Wang et al. |
| 2012/0252213 | A1 | 10/2012 | Singh et al. |
| 2015/0114928 | A1* | 4/2015 | Chu .................. C09G 1/02 216/53 |
| 2016/0013066 | A1 | 1/2016 | Noller et al. |
| 2016/0122590 | A1 | 5/2016 | Lew et al. |
| 2017/0110334 | A1* | 4/2017 | Kawamoto ....... H01L 21/30625 |

OTHER PUBLICATIONS

Hayashi, S. et al; "Chemical Mechanical Polishing of GaN;" Journal of the Electrochemical Society, 2008, pp. H113-H116, vol. 155 No. 2.

Murata, J. et al; "Chemical Planarization of GaN using Hydroxyl Radicals Generated on a Catalyst Plate in H2O2 Solution," Journal of Crystal Growth, 2008, pp. 1637-1641 vol. 310, Elsevier.

Weyher, J.L. et al; "Chemical Polishing of Bulk and Epitaxial GaN;" Journal of Crystal Growth, 1997, pp. 17-22, vol. 182, Elsevier.

Xu, X. et al; "Fabrication of GaN Wafers for Electronic and Optoelectronic Devices;" Optical Materials, 2003, pp. 1-5, vol. 23, Elsevier.

An, J. et al; "Effect of Process Parameters on Material Removal Rate in Chemical Mechanical Polishing of 6H-SiC (0001);" Materials Science Forum, 2009, pp. 831-834, vol. 600-603.

Tavernier, P.R. et al; "Chemical Mechanical Polishing of Gallium Nitride"; Electrochemical and Solid-State Letters, 2002, pp. G61-G64, vol. 5, No. 8.

International Search Report for PCT/US2010/027250 dated Oct. 13, 2010, 2 pages.

Nanodiamonds.com "Nano Diamonds" Archived on Sep. 13, 2008 from Internet Archive Wayback Machine, available at: http://www.nanodiamond.com.ua/NANO.HTM, Archive available from: http://web.archive.org/web/2008913142423/http://www.nanodiamond.com.ua/NANO.HTM.

Korets, A.Y. et al. "Molecular structural nonuniformity of ultradispersed diamond-containing material and the reasons why is arises," Russian Journal of Physical Chemistry B, 2007, pp. 485-492, vol. 1, No. 5.

International Search Report and Written Opinion for PCT/US2017/052604, dated Jan. 2, 2018, 13 pages.

Asghar et al., "Effect of Polishing Parameters on Chemical Mechanical Planarization of C-Plane (0001) Gallium Nitride Surface Using SiO2 and Al2O3 Abrasives," Journal of Solid State Science and Technology, 2014, pp. P277-P284, vol. 3, Issue 8, ECS.

\* cited by examiner

CHEMICAL MECHANICAL PLANARIZATION SLURRY AND METHOD FOR FORMING SAME

CROSS-REFERENCE TO RELATED APPLICATION

This Application claims priority under 35 U.S.C. § 119(e) to U.S. Provisional Patent Application No. 62/398,960, entitled "CHEMICAL MECHANICAL PLANARIZATION SLURRY AND METHOD FOR FORMING SAME," by Ian Sines et al., filed on Sep. 23, 2016, which is assigned to the current assignee hereof and is incorporated herein by reference in its entirety.

BACKGROUND

Field of the Disclosure

The following is directed to a CMP slurry, and more particularly, a CMP slurry including a particulate material and an oxidizer.

Description of the Related Art

Gallium nitride based structures are recognized as a promising material for short wavelength optoelectronic devices and high-power, high-frequency electronic devices. However, the potential of this material has been limited by the lack of a suitable lattice matched substrate for epitaxially grown device layers. This has led to the development of bulk GaN substrates. With the development of these substrates, surface preparation techniques must also be investigated to provide atomically smooth, damage-free surfaces, such as chemical mechanical planarization (CMP). Additionally, alternative processes that may further expand GaN technologies, including wafer bonding, and layer transfer techniques, often require planarization steps creating a need for a well-controlled GaN CMP process.

CMP uses a combination of chemical and mechanical reactions to remove material leaving a planarized, damage-free surface. Ideally, material removal is achieved by chemically altering the surface to a mechanically weaker form. This material is then abraded from the surface leaving the bulk undisturbed. Planarization occurs due to the acceleration of both mechanical grinding and chemical transformation at the high points. While CMP slurries have been developed, a need exists for improved CMP slurries.

SUMMARY

According to one aspect, a CMP slurry includes a carrier, a particulate material within the carrier including an oxide, carbide, nitride, boride, diamond or any combination thereof, an oxidizer including at least one material selected from the group of peroxides, persulfates, permanganates, periodates, perchlorates, hypocholorites, iodates, peroxymonosulfates, cerric ammonium nitrate, periodic acid, ferricyanides, or any combination thereof, and a material removal rate index (MRR) of at least 500 nm/hr and an average roughness index (Ra) of not greater than 5 Angstroms according to the Standardized Polishing test.

DETAILED DESCRIPTION

The following is directed to a CMP slurry for using in chemical mechanical planarization of wafers. Some suitable wafer materials that can be finished with the CMP slurry can include semiconductor materials, such as Group III-V compounds. Group III-V compounds can include those compounds including at least one Group III and Group V element from the Periodic Table of elements. Some suitable examples of Group III-V compounds can include nitride compounds, such as gallium nitride (GaN) materials. Notably, the CMP slurry can be used on a wafer to obtain a damage-free surface, which is epi-ready (i.e. ready for growing by homo-epitaxy).

According to one aspect, a CMP slurry can include a carrier, a particulate material within the carrier, and an oxidizer. According to one embodiment, the carrier can be a liquid material configured to contain the particulate material, oxidizer and any other components within the slurry. The carrier can be a polar or non-polar material. In at least one embodiment, the carrier can include water. In particular instances, the carrier can consist essentially of water, such as deionized water.

The CMP slurry may be formed to include a particular content of the carrier. For example, the slurry can include a content of the carrier within a range of at least 50 wt % and not greater than 99.5 wt % for total weight of the slurry. Notably, the carrier may represent the majority component within the slurry, such that the content (wt %) of the carrier in the slurry is greater than all other components (e.g., particulate material, oxidizer, etc.) within the slurry.

As noted herein, the CMP slurry can include a particulate material that can be contained within the carrier. The particulate material can be an abrasive material that is configured to conduct material removal operations during use of the CMP slurry. In at least one embodiment, the slurry can include a certain content of the particulate material, such as not greater 30 wt % for the total weight of the slurry. In still other instances, the content of the particulate material within the slurry can be not greater than 25 wt %, such as not greater than 20 wt % or not greater than 15 wt % or not greater than 10 wt % or not greater than 8 wt % or not greater than 6 wt % or not greater than 5 wt % or not greater than 4 wt % or not greater than 3 wt % or not greater than 2 wt % or not greater than 1 wt %. Still, in at least one non-limiting embodiment, the particulate material can be present in an amount of at least 0.5 wt % of the total weight of the slurry, such as at least 0.8 wt % or at least 1 wt % or at least 1.3 wt % at least 1.5 wt % or at least 1.7 wt % or at least 2 wt % or at least 2.5 wt % or at least 3 wt % or at least 3.5 wt % or at least 4 wt % or at least 5 wt %. It will be appreciated that the particulate material can be present in an amount within a range including any of the minimum and maximum percentages noted above, including for example, within a range of at least 0.5 wt % and not greater than 30 wt %, such as within a range of at least 0.5 wt % and not greater than 20 wt %, or even within a range including at least 3 wt % and not greater than 10 wt %.

In certain instances, the particulate material can include an oxide, boride, carbide, nitride, or a combination thereof. In at least one embodiment, the particulate material can be an abrasive particle. The particulate material can include one or more oxides, such as alumina, silica, zirconia, ceria, manganese dioxide, iron oxide, or a combination thereof. Suitable carbides may include silicon carbide, boron carbide, or a combination thereof. In at least one embodiment, the abrasive particles can consist essentially of alumina. In yet another embodiment, the abrasive particles can consist essentially of silica. In still another embodiment, the particulate material can include a superabrasive material, which may include certain materials such as diamond, boron nitride, or any combination thereof.

In one non-limiting embodiment, the abrasive particles may have a particular hardness facilitating certain performance of the CMP slurry. For example, the abrasive particles may have a Mohs hardness of at least 7, such as at least 8 or even at least 9.

In certain instances, the particulate material can include a certain composition that may facilitate improved performance of the slurry. For example, the particulate material may include alumina of a hydrated or polymorphic form. Some suitable and non-limiting examples of hydrated alumina may include boehmite, gibbsite, bayerite, diaspore, or a combination thereof. According to one embodiment, polymorphic alumina may include chi-phase alumina, eta-phase alumina, rho-phase alumina, gamma-phase alumina, theta-phase alumina, kappa-phase alumina, delta-phase alumina, alpha-phase alumina, or any combination thereof.

In one particular embodiment, the, alumina-containing material can include alpha alumina and may contain a majority content of alpha alumina. For example, the particulate material can include at least 60 wt % alpha alumina for the total weight of the particulate material, such as at least 70 wt % or at least 80 wt % or at least 90 wt % or even at least 95 wt %. In one embodiment, the particulate material consists essentially of alpha alumina.

In another embodiment, the particulate material may include at least one other polymorphic form alumina besides the alpha-phase alumina, such as a transition phase of alumina like chi-phase alumina, eta-phase alumina, rho-phase alumina, gamma-phase alumina, theta-phase alumina, kappa-phase alumina, delta-phase alumina or any combination thereof. In at least one instance, the transition phase alumina consists essentially of theta phase alumina. More particularly, the entirety of the transition phase alumina present within the particulate material can be theta phase alumina.

The particulate material may include a certain content of transition phase alumina, which may facilitate improved performance of the slurry. For example, the particulate material may include at least 0.5 wt % of the transition phase alumina for the total weight of the particulate material. In other instances, the content of the transition phase alumina in the particulate material can be or at least 0.8 wt % or at least 1 wt % or at least 1.5 wt % at least 2 wt % or at least 2.5 wt % or at least 3 wt % or at least 3.5 wt % or at least 4 wt % or at least 4.5 wt % or even at least 5 wt % for the total weight of the particulate material. Still, in at least one non-limiting embodiment, the particulate material may include not greater than 20 wt % of the transition phase alumina for the total weight of the particulate material, such as not greater than 19 wt % or not greater than 18 wt % or not greater than 17 wt % or not greater than 16 wt % or not greater than 15% or not greater than 14 wt % or not greater than 13 wt % or not greater than 12 wt % or not greater than 11 wt % or not greater than 10 wt % or not greater than 9 wt % or not greater than 8 wt % or not greater than 7 wt % or not greater than 6 wt % or not greater than 5 wt % or not greater than 4 wt % or not greater than 3 wt % or not greater than 2 wt % or not greater than 1.5 wt % or not greater than 1 wt % or not greater than 0.5 wt % or not greater than 0.1 wt % or even not greater than 0.01 wt % of the transition phase alumina for the total weight of the particulate material. The content of the transition phase alumina in the particulate material can be within a range including any of the minimum and maximum percentages noted above, including for example, within a range of at least 0.5 wt % and not greater than 20 wt % or within a range of at least 1 wt % and not greater than 10 wt % or within a range including at least 2 wt % and not greater than 10 wt %.

As noted herein, the particulate material may include a hydrated alumina material, and more particularly, may include a combination of a transition phase of alumina and a hydrated alumina (i.e., aluminum hydroxide). In certain instances, the content of aluminum hydroxide (wt %) within the particulate material can be greater than the content (wt %) of the transition phase of alumina within the particulate material.

According to one embodiment, the particulate material can include an amount of aluminum hydroxide of at least 0.1 wt % for a total weight of the particulate material, such as at least 0.5 wt % or at least 1 wt % or at least 1.5 wt % or at least 2 wt % or at least 2.5 wt % or at least 3 wt % or at least 3.5 wt % or at least 4 wt % or at least 4.5 wt % or at least 5 wt % or at least 5.5 wt % or at least 6 wt % or at least 6.5 wt % or at least 7 wt % or at least 7.5 wt % or at least 8 wt % or at least 8.5 wt % or at least 9 wt % or at least 10 wt %. In another non-limiting embodiment, the particulate material can include an amount of aluminum hydroxide of not greater than 10 wt %, such as not greater than 9.5 wt % or not greater than 9 wt % or not 8.5 wt % or not greater than 8 wt % or not greater than 7.5 wt % or not greater than 7 wt % or not greater than 6.5 wt % or not greater than 6 wt % or not greater than 5.5 wt % or not greater than 5 wt % or not greater than 4.5 wt % or not greater than 4 wt % or not greater than 3.5 wt % or not greater than 3 wt % or not greater than 2.5 wt % or not greater than 2 wt % or not greater than 1.5 wt %. The content of the aluminum hydroxide in the particulate material can be within a range including any of the minimum and maximum percentages noted above, including for example within a range of at least 0.1 wt % and not greater than 10 wt % or within a range of at least 1 wt % and not greater than 5 wt % or within a range including at least 1 wt % and not greater than 3 wt %.

In still another embodiment, the particulate material may include a combination of alpha alumina, a transition phase alumina, and aluminum hydroxide. In such embodiments, the content of the alpha alumina may be greater than the content of aluminum hydroxide. Moreover, in such embodiments, the content of aluminum hydroxide may be greater than the content of the transition phase alumina within the particulate material.

While certain embodiments herein have noted that the particulate material can include certain types of oxides, carbides, and/or nitrides, it will be appreciated that in certain embodiments, the particulate material can be essentially free or free of certain species. For example, in one non-limiting embodiment, the particulate material can be essentially free of titanium oxide, silicon dioxide, zirconium oxide, cesium oxide, borides, nitrides, carbides, diamond, or any combination thereof. Reference herein to a composition that is essentially free of a reference material is reference to a composition that includes none of the reference material or trace amounts of the reference material. In such instances where the reference material is presence in trace amounts, such amounts are not sufficient to affect the properties of the composition.

According to one aspect, the CMP slurry may include an oxidizer. Some suitable examples of oxidizers include materials such as peroxides, persulfates, permanganates, periodates, perchlorates, hypocholorites, iodates, peroxymonosulfates, cerric ammonium nitrate, periodic acid, ferricyanides, or any combination thereof. In at least one embodiment, the oxidizer includes potassium permanganate ($KMnO_4$). In more particular instances, the oxidizer may consist essentially of potassium permanganate ($KMnO_4$).

The oxidizer may be present in the slurry in a particular amount, which may facilitate improved performance of the slurry. For example, the slurry may include a content of the oxidizer in an amount within a range of at least 1 g/L (grams/liter) and not greater than 20 g/L. All reference to content of oxidizer in g/L is reference to liters of slurry. In at least one embodiment, the oxidizer can be present in an amount of at least 2 g/L, such as at least 3 g/L or at least 4 g/L or at least 5 g/L. Still, in one non-limiting embodiment, the slurry may include a content of the oxidizer of not greater than 18 g/L, such as not greater than 16 g/L or not greater than 14 g/L or not greater than 12 g/L or not greater than 10 g/L or not greater than 8 g/L or not greater than 6 g/L or not greater than 4 g/L. It will be appreciated that the content of the oxidizer within the slurry can be within a range including any of the minimum and maximum values noted above, including for example, within a range including at least 2 g/L and not greater than 18 g/L, such as within a range of at least 3 g/L and not greater than 16 g/L or even within a range of at least 4 g/L and not greater than 10 g/L.

According to one aspect, the CMP slurry may optionally include a co-particle. The co-particle can be a particle that is distinct and separate from the particulate material. The co-particle may have, but need not necessarily have, abrasive capabilities. In at least one embodiment, the co-particle can have a hardness that is less than the hardness of the particulate material. For example, the co-particle may have a Mohs hardness that is not greater than 8, such as not greater than 7 or not greater than 6.

In at least one embodiment, the co-particle can include a material such as an oxide, carbide, nitride, boride, or any combination thereof. In certain instances, the co-particle can include an element selected from the group of aluminum, calcium, sodium, silicon, titanium, cerium, magnesium, or any combination thereof. In certain instances, the co-particle may be an oxide, such as a silicate, and more particularly, an aluminosilicate or borosilicate material. In at least one embodiment, the co-particle can consist essentially of an aluminosilicate. In another embodiment, the co-particle can consist essentially of an aluminosilicate.

The CMP slurry can contain a certain content of the co-particle that may facilitate improved performance of the CMP slurry. For example, the slurry can include not greater 20 wt % of the co-particle for the total weight of the slurry. In still other instances, the content of the co-particle within the slurry can be not greater than 18 wt %, such as not 15 wt % or not greater than 12 wt % or not greater than 10 wt % or not greater than 8 wt % or not greater than 6 wt % or not greater than 5 wt % or not greater than 4 wt % or not greater than 3 wt % or not greater than 2 wt % or not greater than 1 wt %. Still, in at least one non-limiting embodiment, the co-particle can be present in an amount of at least 0.1 wt % of the total weight of the slurry, such as at least 0.2 wt % or at least 0.3 wt % or at least 0.5 wt % or at least 0.8 wt % or at least 1 wt % or at least 1.3 wt % at least 1.5 wt % or at least 1.7 wt % or at least 2 wt % or at least 2.5 wt % or at least 3 wt % or at least 3.5 wt % or at least 4 wt % or at least 5 wt %. It will be appreciated that the co-particle can be present in an amount within a range including any of the minimum and maximum percentages noted above, including for example, within a range of at least 0.1 wt % and not greater than 20 wt %, such as within a range of at least 0.1 wt % and not greater than 10 wt %, or even within a range including at least 0.2 wt % and not greater than 5 wt %.

Furthermore, the CMP slurry may be formed to create a particular relationship between the content (wt %) of the particulate material (PM) relative to the content (wt %) of the co-particle (CP), such that a particulate ratio value CP/PM is defined. In one embodiment, the content of the particulate material can be equal to or greater than the content of the co-particle within the CMP slurry. For example, the particulate ratio value (CP/PM) can be not greater than 1, such as not greater than 0.95 or not greater than 0.9 or not greater than 0.8 or not greater than 0.7 or not greater than 0.6 or not greater than 0.5 or not greater than 0.4 or not greater than 0.3 or not greater than 0.2 or not greater than 0.1. Still, in at least one non-limiting embodiment, the particulate ratio value (CP/PM) can be at least 0.01 or at least 0.05 or at least 0.1 or at least 0.15 or at least 0.2 or at least 0.25 or at least 0.3 or at least 0.35 or at least 0.4 or at least 0.45 or at least 0.5 or at least 0.55 or at least 0.6 or at least 0.65 or at least 0.7 or at least 0.75 or at least 0.8 or at least 0.85 or at least 0.9. It will be appreciated that the particulate ratio value can be within a range including any of the minimum and maximum values noted above, including for example, within a range of at least 0.05 and not greater than 0.95, such as within a range of at least 0.05 and not greater than 0.7 or even within a range including at least 0.1 and not greater than 0.5.

The co-particle may have a particular synergy with one or more components within the CMP slurry, including for example, the particulate material, oxidizer, or other additives. Moreover, it will be understood that the CMP slurry may include a blend of co-particles, wherein the blend includes at least two different types of co-particles. Different types of co-particles can differ from each other based on hardness, composition, average particle size, average crystallite size, particle shape, content or any combination thereof.

According to one embodiment, the CMP slurry may optionally include one or more additives. Some suitable examples of such additives can include surfactants, dispersants, chelating agents, buffers, pH modifiers, or any combination thereof.

The content of one or more additives within the CMP slurry may be less than the content of other components, including for example, the carrier, particulate material, oxidizer, and/or co-particle. In one particular embodiment, the additive may be present in the slurry in an amount within a range of at least 1 g/L (grams/liter) and not greater than 20 g/L. It will be appreciated that this content may refer to the content of one additive or the total content of all additives. Reference herein to grams/liter of additive will be understood to refer to grams of material (i.e., additive) per liter of slurry. In at least one embodiment, the one or more additives can be present in an amount of at least 2 g/L, such as at least 3 g/L or at least 4 g/L or at least 5 g/L. Still, in one non-limiting embodiment, the slurry may include a content of the one or more additives of not greater than 18 g/L, such as not greater than 16 g/L or not greater than 14 g/L or not greater than 12 g/L or not greater than 10 g/L or not greater than 8 g/L or not greater than 6 g/L or not greater than 4 g/L. It will be appreciated that the content of the one or more additives within the slurry can be within a range including any of the minimum and maximum values noted above, including for example, within a range including at least 2 g/L and not greater than 18 g/L, such as within a range of at least 2 g/L and not greater than 12 g/L or even within a range of at least 2 g/L and not greater than 8 g/L.

In at least one embodiment, the CMP slurry can include a pH modifier, which may include an acid, a base, or a combination thereof. In one particular embodiment, the CMP slurry can include an acid and have an acidic pH. For example, the slurry can have a pH of not greater than 6, such as not greater than 5 or not greater than 4 or not greater than 3 or not greater than 2 or not greater than 1.5 or not greater than 1. Still, in one non-limiting embodiment, the CMP slurry can have a pH of at least 0.5, such as at least 0.8 or at least 1 or at least 1.3 or at least 1.5 or at least 1.7 or at least 2 or at least 2.5 or at least 3 or at least 3.5 or at least 4. It will be appreciated that the pH of the CMP slurry can be within a range including any of the minimum and maximum values noted above, including for example, within a range of at least 0.5 and not greater than 6, such as within a range of including at least 1 and not greater than 4 or within a range including at least 1 and not greater than 3.

In at least another embodiment, the CMP slurry of embodiments herein can be used in polishing a substrate that may include a particular material. In particular, according to one embodiment, the CMP slurry of embodiments herein can be used to polish a substrate that may include a Group III-N semiconductor material, such as, a GaN semiconductor material or an AlN semiconductor material or an InN semiconductor material or an InAlN semiconductor material or a BN semiconductor material or a TlN semiconductor material. According to still another embodiment, the CMP slurry of embodiments herein can be used to polish a substrate that may include a Group III-V semiconductor material, such as, a GaAs semiconductor material or an InGaAS semiconductor material or a GaP semiconductor material or an InSb semiconductor material or a InAs semiconductor material or a BAs semiconductor material or an AlAs semiconductor material or an AlSb semiconductor material. According to yet another embodiment, the CMP slurry of embodiments herein can be used to polish a substrate that may include a Group IV semiconductor material, such as, a Si semiconductor material or a Ge semiconductor material or a SiGe semiconductor material or a SiSn semiconductor material or a Diamond semiconductor material or a graphene semiconductor material or a SiC semiconductor material or a GeSn semiconductor material.

In at least another embodiment, the CMP slurry of embodiments herein can be used in polishing a substrate that may consist of a particular material. In particular, according to one embodiment, the CMP slurry of embodiments herein can be used to polish a substrate that may consist of a Group III-N semiconductor material, such as, a GaN semiconductor material or an AlN semiconductor material or an InN semiconductor material or an InAlN semiconductor material or a BN semiconductor material or a TlN semiconductor material. According to still another embodiment, the CMP slurry of embodiments herein can be used to polish a substrate that may consist of a Group III-V semiconductor material, such as, a GaAs semiconductor material or an InGaAS semiconductor material or a GaP semiconductor material or an InSb semiconductor material or a InAs semiconductor material or a BAs semiconductor material or an AlAs semiconductor material or an AlSb semiconductor material. According to yet another embodiment, the CMP slurry of embodiments herein can be used to polish a substrate that may consist of a Group IV semiconductor material, such as, a Si semiconductor material or a Ge semiconductor material or a SiGe semiconductor material or a SiSn semiconductor material or a Diamond semiconductor material or a graphene semiconductor material or a SiC semiconductor material or a GeSn semiconductor material.

The CMP slurry of the embodiments herein has demonstrated remarkable performance compared to other CMP slurries. In particular, the CMP slurry is capable of a combination of material removal rate and average roughness index that is remarkable when compared to conventional CMP slurries. For example, in at least one embodiment, the CMP slurry can have a material removal rate index (MRR) of at least 500 nm/hr and an average roughness index (Ra) of not greater than 5 Angstroms according to a Standardized Polishing Test.

The Standardized Polishing Test is conducted on a 4" diameter GaN wafer (Ga-face). Three GaN wafers having a starting average surface roughness 10-12 Å are wax mounted on alumina discs (4.3 inches in diameter and a thickness of 0.16 inches) and placed into templates on a 36" Speedfam GPAW polisher. Polishing is conducted on the wafers using an Eminess IC 1000 spiral grooved polishing pad. The wafers are processed at 50 RPM platen rotation speed with a downward polishing pressure of 6.4 psi. The slurry flow rate is set at 20 ml/minute and added to the center of the polishing pad for 1 minute before beginning the polishing process. The wafers are processed in three, 60-minute intervals for a total of 180 minutes of processing time. The pad temperature during the polishing process is maintained between 31-32° C. After processing, the wafers are cleaned using a PVA sponge and DI water. The wafers are placed in a ultrasonic bath at 30° C. for 10 minutes. The surfaces of the wafers are dried using a PVA sponge. The wafers are finally cleaned with an isopropanol pre-soaked clean room wipe. It will be appreciated that the Standardized Polishing Test is to be conducted on 4 inch diameter GaN wafers, but the CMP polishing slurry is applicable to any range of wafers, including for example, wafers having a diameter of at least 2 inches or at least 4 inches or at least 6 inches and larger.

Material removal rate is determined by the change in mass of the wafer before and after polishing. The change in mass of the wafer before and after is divided by the time spent polishing to calculate the material removal rate. The mass of the wafers are measured using a benchtop scale. The surface roughness of the wafers is determined using a Bruker Dimension Icon atomic force microscope. The instrument maps a 10×10 um region of the wafer using ScanAsyst Tapping mode. The results for all three wafers are measured and averaged to calculate the average surface roughness index value of the CMP slurry.

As noted herein and according to one embodiment, the CMP slurry can have an average material removal rate index (MRR) of at least 500 nm/hr according to the standardized polishing test. In another embodiment, the average material removal rate index (MRR) can be greater, such as at least 510 nm/hr or at least 520 nm/hr or at least 530 nm/hr or at least 540 nm/hr or at least 550 nm/hr or at least 560 nm/hr or at least 570 nm/hr or at least 580 nm/hr or at least 590 nm/hr or at least 600 nm/hr or at least 610 nm/hr or at least 620 nm/hr or at least 630 nm/hr or at least 640 nm/hr or at least 650 nm/hr or at least 660 nm/hr or at least 670 nm/hr or at least 680 nm/hr or at least 690 nm/hr or at least 700 nm/hr or at least 710 nm/hr or at least 720 nm/hr or at least 730 nm/hr or at least 740 nm/hr or at least 750 nm/hr or at least 760 nm/hr or at least 770 nm/hr or at least 780 nm/hr or at least 790 nm/hr or at least 800. Still, in at least one non-limiting embodiment, the average material removal rate index (MRR) can be not greater than 2000 nm/hr or not greater than 1900 nm/hr or not greater than 1800 nm/hr or not greater than 1700 nm/hr or not greater than 1600 nm/hr or not greater than 1500 nm/hr or not greater than 1400 nm/hr or not greater than 1300 nm/hr or not greater than 1200 nm/hr or not greater than 1100 nm/hr or not greater than 1000 nm/hr or not greater than 900 nm/hr or not greater than 800 nm/hr. It will be appreciated that the average material removal rate index (MRR) can be within a range including any of the minimum and maximum values noted above, including for example, within a range including at least 500 nm/hr and not greater than 2000 nm/hr, such as within a range including at least 500 nm/hr and not greater than 1800 nm/hr or within a range including at least 700 nm/hr and not greater than 1800 nm/hr/

In another aspect and noted herein, the CMP slurry may have a particular average roughness index according to the standardized polishing test. In at least one embodiment, the average roughness index (Ra) can be not greater than 5 Angstroms, such as not greater than 4.5 Angstroms or not greater than 4.2 Angstroms or not greater than 4.0 Angstroms or not greater than 3.8 Angstroms or not greater than 3.5 Angstroms or not greater than 3.2 Angstroms or not greater than 3.0 Angstroms or not greater than 2.8 Angstroms or not greater than 2.5 Angstroms or not greater than 2.2 Angstroms or not greater than 2.0 Angstroms or not greater than 1.8 Angstroms or not greater than 1.5 Angstroms or not greater than 1.2 Angstroms or not greater than 1.0. In one non-limiting embodiment, the average roughness index can be at least 0.1 Angstroms, such as at least 0.5 Angstroms or at least 0.8 Angstroms or at least 1 Angstrom or at least 1.2 Angstroms or at least 1.5 Angstroms. It will be appreciated that the CMP slurries of the embodiments can have an average roughness index within a range including any of the minimum and maximum values noted above, including for example, within a range including at least 0.1 Angstroms and not greater than 5 Angstroms, such as within a range including at least 0.1 Angstroms and not greater than 3 Angstroms or even within a range including at least 0.1 Angstroms and not greater than 2 Angstroms. Moreover, it will be appreciated that the foregoing average roughness index values of the CMP slurry can be combined with any of the foregoing average material removal rate index values noted above.

The CMP slurries of the foregoing embodiments can be formed by selecting a suitable carrier material and adding the desired components to the slurry, such as the particulate material, oxidizer, co-particle, and any other additives. The carrier and components can be mixed together in a suitable manner to ensure homogenous dispersion of the components within the carrier and formation of the CMP slurry. The slurry may then be used in chemical mechanical planarization processes as understood by those of skill in the art.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1

A CMP slurry comprising:
a carrier;
a particulate material within the carrier comprising an oxide, carbide, nitride, boride, diamond or any combination thereof;
an oxidizer comprising at least one material selected from the group of peroxides, persulfates, permanganates, periodates, perchlorates, hypocholorites, iodates, peroxymonosulfates, cerric ammonium nitrate, periodic acid, ferricyanides, or any combination thereof; and a material removal rate index (MRR) of at least 500 nm/hr and an average roughness index (Ra) of not greater than 5 Angstroms according to the Standardized Polishing test.

Embodiment 2

The CMP slurry of embodiment 1, further comprising an acidic pH.

Embodiment 3

The CMP slurry of embodiment 2, wherein the pH is not greater than 6 and at least 0.5.

Embodiment 4

The CMP slurry of embodiment 1, wherein the average material removal rate index (MRR) is at least 510 nm/hr or at least 520 nm/hr or at least 530 nm/hr or at least 540 nm/hr or at least 550 nm/hr or at least 560 nm/hr or at least 570 nm/hr or at least 580 nm/hr or at least 590 nm/hr or at least 600 nm/hr or at least 610 nm/hr or at least 620 nm/hr or at least 630 nm/hr or at least 640 nm/hr or at least 650 nm/hr or at least 660 nm/hr or at least 670 nm/hr or at least 680 nm/hr or at least 690 nm/hr or at least 700 nm/hr or at least 710 nm/hr or at least 720 nm/hr or at least 730 nm/hr or at least 740 nm/hr or at least 750 nm/hr or at least 760 nm/hr or at least 770 nm/hr or at least 780 nm/hr or at least 790 nm/hr or at least 800.

Embodiment 5

The CMP slurry of embodiment 1, wherein the average material removal rate index (MRR) is not greater than 2000 nm/hr or not greater than 1900 nm/hr or not greater than 1800 nm/hr or not greater than 1700 nm/hr or not greater than 1600 nm/hr or not greater than 1500 nm/hr or not greater than 1400 nm/hr or not greater than 1300 nm/hr or not greater than 1200 nm/hr or not greater than 1100 nm/hr or not greater than 1000 nm/hr or not greater than 900 nm/hr or not greater than 800 nm/hr.

Embodiment 6

The CMP slurry of embodiment 1, wherein the average roughness index is not greater than 4.5 Angstroms or not greater than 4.2 Angstroms or not greater than 4.0 Angstroms or not greater than 3.8 Angstroms or not greater than 3.5 Angstroms or not greater than 3.2 Angstroms or not greater than 3.0 Angstroms or not greater than 2.8 Angstroms or not greater than 2.5 Angstroms or not greater than 2.2 Angstroms or not greater than 2.0 Angstroms or not greater than 1.8 Angstroms or not greater than 1.5 Angstroms or not greater than 1.2 Angstroms or not greater than 1.0.

Embodiment 7

The CMP slurry of embodiment 1, further wherein the average roughness index is at least 0.1 Angstroms or at least 0.5 Angstroms or at least 0.8 Angstroms or at least 1 Angstrom or at least 1.2 Angstroms or at least 1.5 Angstroms.

Embodiment 8

The CMP slurry of embodiment 1, wherein the carrier includes water.

Embodiment 9

The CMP slurry of embodiment 1, wherein the particulate material is present in an amount of at least 0.5 wt % and not greater 30 wt % for the total weight of the composition.

Embodiment 10

The CMP slurry of embodiment 1, further comprising one or more additives selected from the group consisting of surfactants, dispersants, chelating agents, buffers, and pH modifiers.

Embodiment 11

The CMP slurry of embodiment 10, wherein a total content of the additives is within a range including at least 1 g/L and not greater than 20 g/L.

Embodiment 12

The CMP slurry of embodiment 1, wherein the oxidizer comprises potassium permanganate ($KMnO_4$).

Embodiment 13

The CMP slurry of embodiment 1, wherein the oxidizer consists of potassium permanganate ($KMnO_4$).

Embodiment 14

The CMP slurry of embodiment 1, wherein the oxidizer is present in an amount within a range including at least 1 g/L and not greater than 20 g/L.

Embodiment 15

The CMP slurry of embodiment 1, further comprising a co-particle including at least one of an oxide, a carbide, a nitride, a boride, diamond or any combination thereof.

Embodiment 16

The CMP slurry of embodiment 15, wherein the co-particle includes at least one element selected from the group of aluminum, calcium, sodium, silicon, titanium, cerium, magnesium, manganese, iron, or any combination thereof.

Embodiment 17

The CMP slurry of embodiment 15, wherein the co-particle comprises a silicate.

Embodiment 18

The CMP slurry of embodiment 15, wherein the co-particle comprises an aluminosilicate.

Embodiment 19

The CMP slurry of embodiment 15, wherein the co-particle consists essentially of an aluminosilicate.

Embodiment 20

The CMP slurry of embodiment 1, wherein the particulate material includes at least 50 wt % alumina particles

Embodiment 21

The CMP slurry of embodiment 1, wherein the particulate material consists essentially of alumina.

Embodiment 22

The CMP slurry of embodiment 1, wherein the particulate material comprises at least one transition phase of alumina.

Embodiment 23

The CMP slurry of embodiment 1, wherein the particulate material comprises at least 0.5 wt % and not greater than 20 wt % of the transition phase alumina for the total weight of the particulate material.

Embodiment 24

The CMP slurry of embodiment 1, wherein the particulate material comprises aluminum hydroxide.

Embodiment 25

The CMP slurry of embodiment 24, wherein the aluminum hydroxide is present in an amount of at least 0.1 wt % and not greater than 10 wt % for a total weight of the particulate material.

Embodiment 26

The CMP slurry of embodiment 1, wherein the particulate material comprises alpha alumina, a transition phase alumina, and aluminum hydroxide, wherein the content of the alpha alumina is greater than the content of aluminum hydroxide and the content of aluminum hydroxide is greater than a content of the transition phase alumina.

Embodiment 27

The CMP slurry of embodiment 1, configured for use on a wafer having a diameter of at least 2 inches or at least 4 inches or at least 6 inches.

Embodiment 28

The CMP slurry of embodiment 1, configured for use on a wafer to obtain a damage-free surface which is epi-ready.

Embodiment 29

The CMP slurry of embodiment 1, wherein the CMP slurry is used to polish a substrate comprising a Group III-N semiconductor material.

Embodiment 30

The CMP slurry of embodiment 29, wherein the CMP slurry is used to polish a substrate comprising a GaN semiconductor material or an AlN semiconductor material, an InN semiconductor material or an InAlN semiconductor material or a BN semiconductor material or a TlN semiconductor material.

Embodiment 31

The CMP slurry of embodiment 1, wherein the CMP slurry is used to polish a substrate comprising a Group III-V semiconductor material.

Embodiment 32

The CMP slurry of embodiment 31, wherein the CMP slurry is used to polish a substrate comprising a GaAs semiconductor material or an InGaAS semiconductor material or a GaP semiconductor material or an InSb semiconductor material or a InAs semiconductor material or a BAs semiconductor material or an AlAs semiconductor material or an AlSb semiconductor material.

Embodiment 33

The CMP slurry of embodiment 1, wherein the CMP slurry is used to polish a substrate comprising a Group IV semiconductor material.

Embodiment 34

The CMP slurry of embodiment 33, wherein the CMP slurry is used to polish a substrate comprising a Si semiconductor material or a Ge semiconductor material or a SiGe semiconductor material or a SiSn semiconductor material or a Diamond semiconductor material or a graphene semiconductor material or a SiC semiconductor material or a GeSn semiconductor material.

Embodiment 35

The CMP slurry of embodiment 1, wherein the CMP slurry is used to polish a substrate consisting of a Group III-N semiconductor material.

Embodiment 36

The CMP slurry of embodiment 35, wherein the CMP slurry is used to polish a substrate consisting of a GaN semiconductor material or an AlN semiconductor material, an InN semiconductor material or an InAlN semiconductor material or a BN semiconductor material or a TlN semiconductor material.

Embodiment 37

The CMP slurry of embodiment 1, wherein the CMP slurry is used to polish a substrate consisting of a Group III-V semiconductor material.

Embodiment 38

The CMP slurry of embodiment 37, wherein the CMP slurry is used to polish a substrate consisting of a GaAs semiconductor material or an InGaAS semiconductor material or a GaP semiconductor material or an InSb semiconductor material or a InAs semiconductor material or a BAs semiconductor material or an AlAs semiconductor material or an AlSb semiconductor material.

Embodiment 39

The CMP slurry of embodiment 1, wherein the CMP slurry is used to polish a substrate consisting of a Group IV semiconductor material.

Embodiment 40

The CMP slurry of embodiment 39, wherein the CMP slurry is used to polish a substrate consisting of a Si semiconductor material or a Ge semiconductor material or a SiGe semiconductor material or a SiSn semiconductor material or a Diamond semiconductor material or a graphene semiconductor material or a SiC semiconductor material or a GeSn semiconductor material.

EXAMPLES

Example 1

A CMP slurry representative of one of the embodiments was formed as Sample 1. Sample 1 included approximately 95-97 wt % deionized water, approximately 2-3 wt % of an alumina material which included approximately 93-96 wt % alpha alumina, 3-5 wt % gibbsite, and 0.5-2 wt % theta alumina (sum totaling 100%), 0.55 wt % oxidizer, 0.54 wt % of a co-particle of an aluminosilicate dispersant. Sample 1 had a pH of approximately 1.5.

Sample 1 was tested according to the Standardized Polishing test and demonstrated a material removal rate index of approximately 800 nm/hr and an average roughness index (Ra) of approximately 0.2 Angstroms.

Example 2

A CMP slurry representative of one of the embodiments was formed as Sample 2. Sample 2 included 96.95 wt % deionized water, 2 wt % of an alumina material (which included approximately 93-96 wt % alpha alumina, 3-5 wt % gibbsite, and 0.5-2 wt % theta alumina (sum totaling 100%), 0.55 wt % potassium permanganate (i.e., oxidizer), and 0.5 wt % of a co-particle of an aluminosilicate dispersant. Sample 2 had a pH of approximately 1.5.

Sample 2 was tested according to the Standardized Polishing test and demonstrated a material removal rate index of 800 nm/hr and an average roughness index (Ra) of 1.31 Angstroms. A visual inspection of the polished workpiece after the Standardized Polishing Test revealed no scratches on the surface of the workpiece.

Example 3

A comparative CMP slurry was formed as Sample 3. Sample 3 included 97.38 wt % deionized water, 2 wt % of an alumina material (which included approximately 93-96 wt % alpha alumina, 3-5 wt % gibbsite, and 0.5-2 wt % theta alumina (sum totaling 100%)), 0.12 wt % hydrogen peroxide (i.e., oxidizer), and 0.5 wt % of a co-particle of an aluminosilicate dispersant. Sample 3 had a pH of approximately 1.5.

Sample 3 was tested according to the Standardized Polishing test and demonstrated a material removal rate index of 478 nm/hr and an average roughness index (Ra) of 7.78 Angstroms. A visual inspection of the polished workpiece after the Standardized Polishing revealed a high number of scratches and pits on the surface of the workpiece.

Example 4

A comparative CMP slurry was formed as Sample 4. Sample 4 included 96.7 wt % deionized water, 2 wt % of an alumina material (which included approximately 93-96 wt % alpha alumina, 3-5 wt % gibbsite, and 0.5-2 wt % theta alumina (sum totaling 100%)), 0.8 wt % potassium periodate (i.e., oxidizer), and 0.5 wt % of a co-particle of an aluminosilicate dispersant. Sample 4 had a pH of approximately 1.5.

Sample 4 was tested according to the Standardized Polishing test and demonstrated a material removal rate index of 456 nm/hr and an average roughness index (Ra) of 5.60 Angstroms. A visual inspection of the polished workpiece after the Standardized Polishing revealed a high number of scratches and pits on the surface of the workpiece.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A CMP slurry comprising:
   a carrier;
   a particulate material within the carrier comprising an alumina-containing material, wherein the alumina-containing material comprises a majority content of alpha alumina and a transition phase alumina at a content of at least 0.5 wt. % and not greater than 20 wt. % for a total weight of the particulate material;
   an oxidizer comprising at least one material selected from the group of peroxides, persulfates, permanganates, periodates, perchlorates, hypocholorites, iodates, peroxymonosulfates, cerric ammonium nitrate, periodic acid, ferricyanides, or any combination thereof; and
   a material removal rate index (MRR) of at least 500 nm/hr and an average roughness index (Ra) of not greater than 5 Angstroms according to the Standardized Polishing test.

2. The CMP slurry of claim 1, further comprising an acidic pH.

3. The CMP slurry of claim 2, wherein the pH is not greater than 6 and at least 0.5.

4. The CMP slurry of claim 1, wherein the average material removal rate index (MRR) is at least 510 nm/hr.

5. The CMP slurry of claim 1, wherein the average material removal rate index (MRR) is not greater than 2000 nm/hr.

6. The CMP slurry of claim 1, wherein the average roughness index is not greater than 4.5 Angstroms.

7. The CMP slurry of claim 1, further wherein the average roughness index is at least 0.1 Angstroms.

8. The CMP slurry of claim 1, wherein the carrier includes water.

9. The CMP slurry of claim 1, wherein the particulate material is present in an amount of at least 0.5 wt % and not greater 30 wt % for the total weight of the composition.

10. The CMP slurry of claim 1, further comprising one or more additives selected from the group consisting of surfactants, dispersants, chelating agents, buffers, and pH modifiers.

11. The CMP slurry of claim 10, wherein a total content of the additives is within a range including at least 1 g/L and not greater than 20 g/L.

12. The CMP slurry of claim 1, wherein the oxidizer comprises potassium permanganate ($KMnO_4$).

13. The CMP slurry of claim 1, wherein the oxidizer consists of potassium permanganate ($KMnO_4$).

14. The CMP slurry of claim 1, wherein the oxidizer is present in an amount within a range including at least 1 g/L and not greater than 20 g/L.

15. The CMP slurry of claim 1, further comprising a co-particle including at least one of an oxide, a carbide, a nitride, a boride, diamond or any combination thereof.

16. The CMP slurry of claim 15, wherein the co-particle includes at least one element selected from the group of aluminum, calcium, sodium, silicon, titanium, cerium, magnesium, manganese, iron, or any combination thereof.

17. The CMP slurry of claim 15, wherein the co-particle comprises a silicate.

18. The CMP slurry of claim 15, wherein the co-particle comprises an aluminosilicate.

19. The CMP slurry of claim 1, wherein the CMP slurry is used to polish a substrate comprising a Group III-N semiconductor material or a Group III-V semiconductor material or a Group IV semiconductor material.

* * * * *